(12) United States Patent
Burgess

(10) Patent No.: US 11,714,121 B2
(45) Date of Patent: Aug. 1, 2023

(54) INDICATING A PROBING TARGET FOR A FABRICATED ELECTRONIC CIRCUIT

(71) Applicant: Tektronix, Inc., Beaverton, OR (US)

(72) Inventor: David Everett Burgess, Beaverton, OR (US)

(73) Assignee: Tektronix, Inc.

( * ) Notice: Subject to any disclaimer, the term of this patent is extended or adjusted under 35 U.S.C. 154(b) by 18 days.

(21) Appl. No.: 17/370,958

(22) Filed: Jul. 8, 2021

(65) Prior Publication Data

US 2022/0026483 A1 Jan. 27, 2022

Related U.S. Application Data

(60) Provisional application No. 63/050,053, filed on Jul. 9, 2020.

(51) Int. Cl.
*G01R 31/28* (2006.01)
*H01L 21/66* (2006.01)
*G01N 21/95* (2006.01)

(52) U.S. Cl.
CPC ..... *G01R 31/2818* (2013.01); *G01N 21/9503* (2013.01); *H01L 22/12* (2013.01)

(58) Field of Classification Search
CPC .......... G06T 17/00; G06T 7/10; G06T 11/003
See application file for complete search history.

(56) References Cited

U.S. PATENT DOCUMENTS

| | | | |
|---|---|---|---|
| 8,422,825 B1 * | 4/2013 | Neophytou | G06T 19/003 382/294 |
| 2001/0005815 A1 | 6/2001 | Rosenberg et al. | |
| 2004/0015079 A1 * | 1/2004 | Berger | G01S 7/5208 600/443 |
| 2005/0010890 A1 * | 1/2005 | Nehmadi | G03F 1/36 700/121 |

(Continued)

FOREIGN PATENT DOCUMENTS

| | | |
|---|---|---|
| JP | 08-262114 | 10/1996 |
| JP | 11-345883 | 12/1999 |

OTHER PUBLICATIONS

Korean Intellectual Property Office, International Search Report and Written Opinion for International Application PCT/US2021/040964, dated Oct. 29, 2021, 10 pages, Daejeon, Republic of Korea.

*Primary Examiner* — Jermele M Hollington
*Assistant Examiner* — Temilade S Rhodes-Vivour
(74) *Attorney, Agent, or Firm* — Miller Nash LLP; Andrew J. Harrington

(57) ABSTRACT

A method for indicating a probing target for a fabricated electronic circuit including: generating an electronic, three-dimensional model based on manufacturing layout information of a fabricated circuit; obtaining, with a vision system, visual environment information for the fabricated circuit; scaling and orienting the three-dimensional model by a scaler and mapper based on the visual environment information; overlaying the three-dimensional model with the visual environment information to produce a correlated (Continued)

image; obtaining an identification of a desired network node of the fabricated circuit; and indicating a probing target, the probing target corresponding to the desired network node of the fabricated circuit.

24 Claims, 3 Drawing Sheets

(56) References Cited

U.S. PATENT DOCUMENTS

| | | | | |
|---|---|---|---|---|
| 2007/0230770 | A1* | 10/2007 | Kulkarni | G06T 7/33 |
| | | | | 382/149 |
| 2015/0007121 | A1 | 1/2015 | Lin et al. | |
| 2015/0346701 | A1* | 12/2015 | Gordon | G05B 15/02 |
| | | | | 700/275 |
| 2015/0347854 | A1* | 12/2015 | Bare | G01S 5/00 |
| | | | | 345/633 |
| 2020/0064372 | A1 | 2/2020 | Arlinsky et al. | |

* cited by examiner

INDICATING A PROBING TARGET FOR A FABRICATED ELECTRONIC CIRCUIT

CROSS-REFERENCES TO RELATED APPLICATIONS

This patent application claims the benefit of provisional Application No. 63/050,053 filed Jul. 9, 2020. That application is incorporated into the present disclosure by this reference.

TECHNICAL FIELD

The subject matter is related to a system and methods for indicating a probing target for a fabricated electronic circuit.

BACKGROUND

The process of identifying a location to probe an electronic circuit to determine what signals are on a particular portion of the circuit (i.e. a network node) is a multi-step process that previously required (a) identifying the network node in the circuit schematic, (b) identifying, on the printed circuit assembly layout, a portion of the network node that can be accessed with a probing device, and (c) then probing the desired network node while the circuit is operating to see if it matches expected operations. This process can be laborious and time consuming and can result in probing the wrong portion of the circuit.

Configurations of the disclosed technology address shortcomings in the prior art.

DETAILED DESCRIPTION

As described in this disclosure, aspects are directed to methods for indicating a probing target for a fabricated electronic circuit. Hence, configurations of the disclosed technology automate the process of locating the desired probing point for the fabricated circuit and indicating a probing target or providing a mechanical position based on the geometry of the circuit assembly and the manufacturing layout information used to create the assembly. Configurations allow the user, or an automated process, to select a network node and provide a guiding indicator for attaching a probe.

Figure 1:
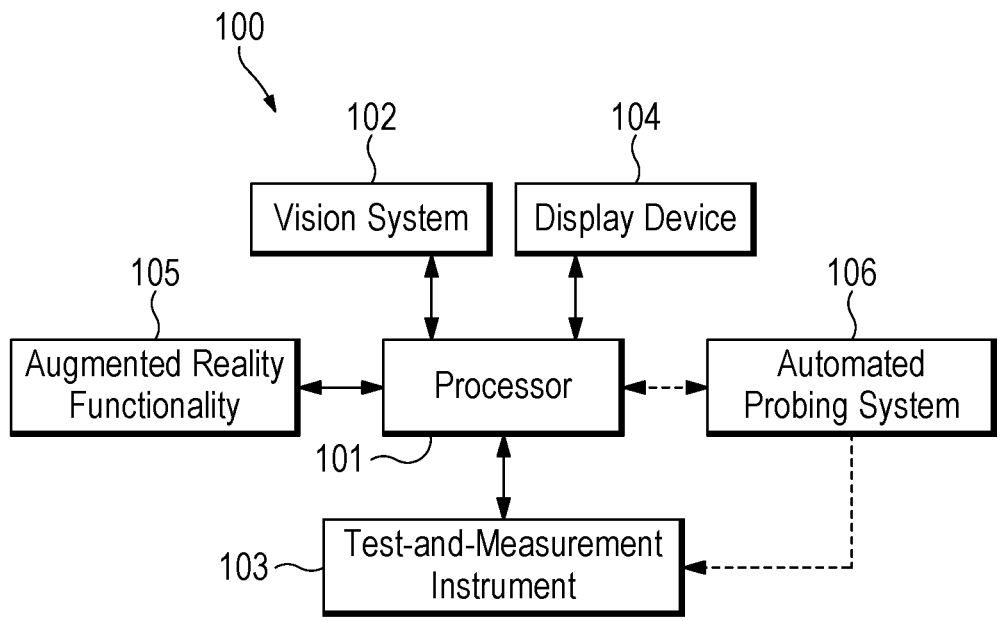
FIG. 1 is a functional block diagram of an example configuration of components of a system configured to indicate a probing target for a fabricated electronic circuit.
Figure 2:
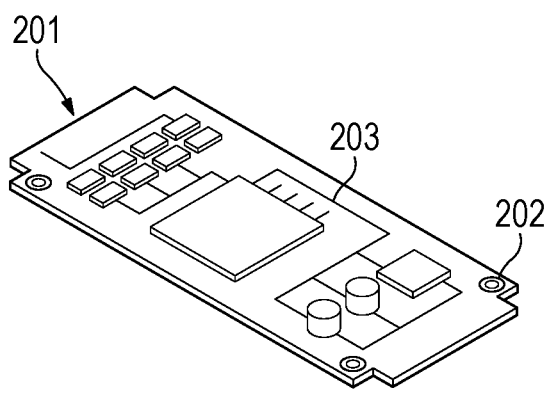
FIG. 2 illustrates an example of a fabricated circuit.
Figure 3:
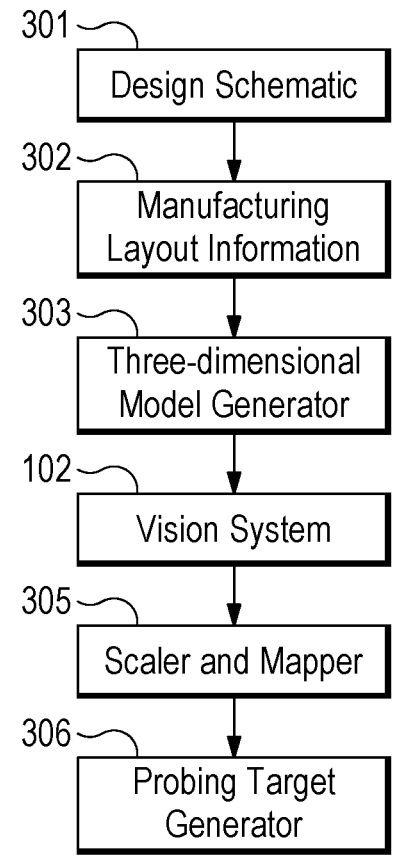
FIG. 3 is a functional block diagram showing an example arrangement of functional components for aspects of a system configured to indicate a probing target for a fabricated electronic circuit.

FIG. 1 is a functional block diagram of an example configuration of components of a system 100 configured to indicate a probing target for a fabricated electronic circuit 201. FIG. 2 illustrates an example of a fabricated circuit 201. FIG. 3 is a functional block diagram showing an example arrangement of functional components for aspects of a system configured to indicate a probing target for a fabricated electronic circuit. FIG. 4 illustrates a method 400 for indicating a probing target for a fabricated electronic circuit, according to an example configuration.

Figure 4A:
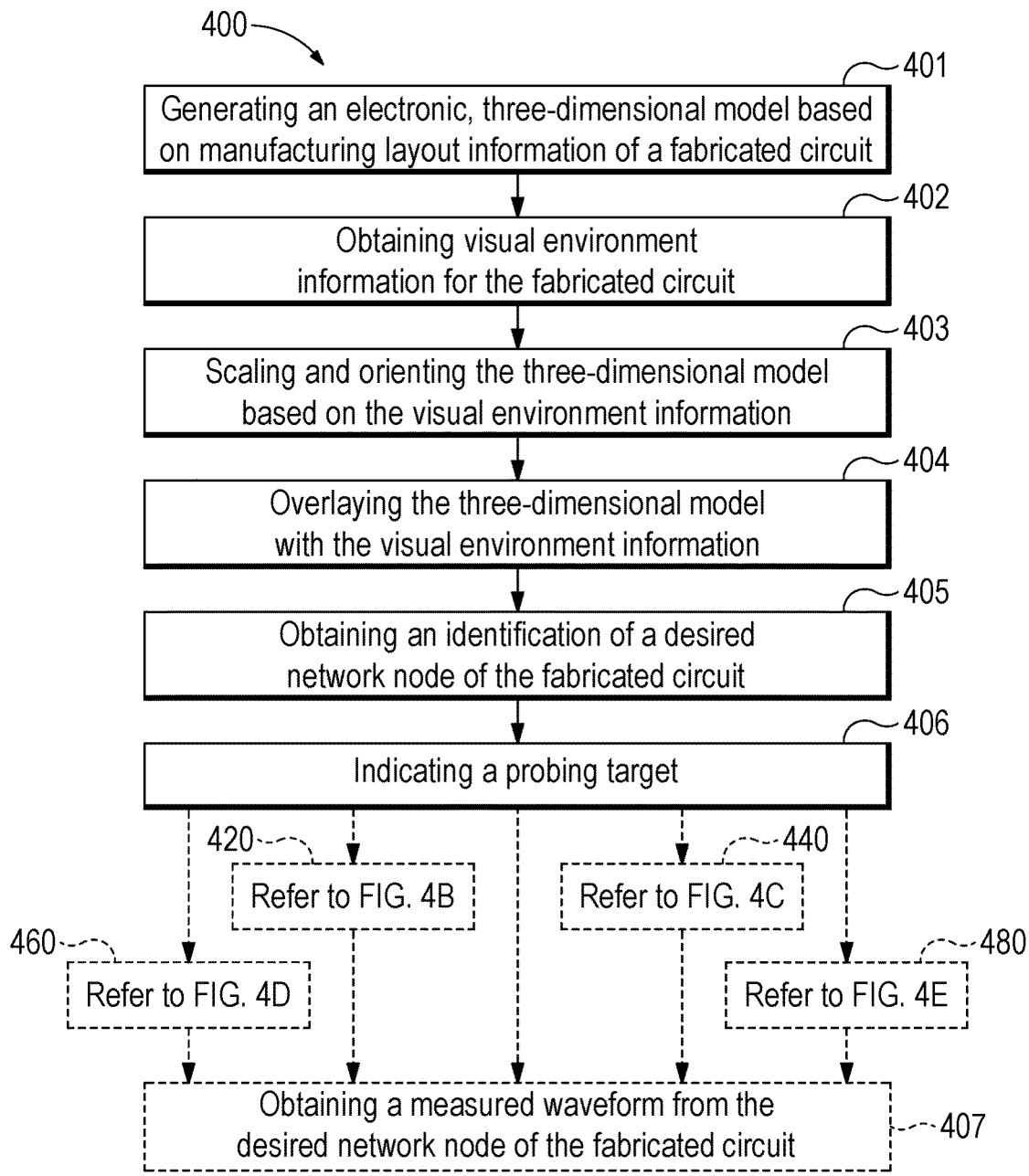
FIG. 4A illustrates a method for indicating a probing target for a fabricated electronic circuit, according to an example configuration.

With reference to FIGS. 1-4, and particular reference to FIG. 4A, at the process labeled 401 an electronic, three-dimensional model representation of a fabricated circuit 201 is generated from manufacturing layout information 302 for the fabricated circuit 201. The three-dimensional model may be generated by a three-dimensional model generator 303. The manufacturing layout information 302, which is sometimes known as layout fabrication information, corresponds to a design schematic 301 for the fabricated circuit 201. In this context, "corresponding to" means that, functionally, the manufacturing layout information 302 substantially matches the fabricated circuit 201. As used in this disclosure, "substantially matches" means largely or essentially equivalent, without requiring perfect identicalness.

At the process labeled 402, a vision system 102 obtains visual environment information (information about the visual environment) for the fabricated circuit 201. The vision system 102 may be, for example, part of an augmented reality system or a machine vision system. In configurations, the visual environment information may include the locations of one or more fiducial markers 202 for the fabricated circuit 201.

Using the visual environment information from the vision system 102, at the process labeled 403 a scaler and mapper 305 may scale and orient the three-dimensional model of the fabricated circuit 201. In configurations, scaling and orienting the three-dimensional model may include using edge detecting methods and pattern matching techniques on the visual environment information to identify edges of the fabricated circuit 201 and patterns in the manufacturing layout information 302 (which is represented by the three-dimensional model) that can be matched to patterns in the visual environment information.

At the process labeled 404, the three-dimensional model may be overlaid with the visual environment information to produce a correlated image, the correlated image being an image that includes the three-dimensional model and the visual environment information. Accordingly, the circuit nodes of the fabricated circuit 201 (which is represented by the three-dimensional model) are correlated with the visual environment of the fabricated circuit 102 (represented by the visual environment information) to allow accurate specification of probing points on the fabricated circuit 102.

At the process labeled 405, an identification of a desired network node 203 of the fabricated circuit 201 is obtained.

At the process labeled 406, a probing target is indicated. The probing target corresponds to the desired network node of the fabricated circuit. The probing target may be generated by a probing target generator 306. As described below, the indication may be, as examples, a visual indication to a human operator or an electronic indication to an augmented reality functionality 105 or to an automated probing system 106. This indicating process 406 helps to ensure accurate probing of the circuit by clearly identifying the probing target to the human operator or other electronic system.

In configurations, at the process labeled 407, a test-and-measurement instrument 103 may obtain a measured waveform from the desired network node 203 of the fabricated circuit 201. In configurations, the test-and-measurement instrument 103 may comprise an oscilloscope.

Figure 4B:
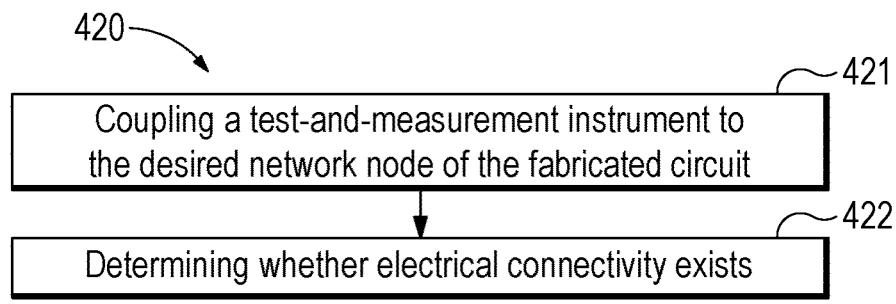
FIG. 4B illustrates a portion of the method of FIG. 4A, according to an example configuration.

With particular reference to FIG. 4B, in configurations, at the process labeled 420 (beginning with the sub-process labeled 421), a probe may be coupled between the desired network node 203 of the fabricated circuit 201 and the test-and-measurement instrument 103. At the sub-process labeled 422, a determination may be made as to whether electrical connectivity exists between the desired network node 203 of the fabricated circuit 201 and the test-and-measurement instrument 103.

Figure 4C:
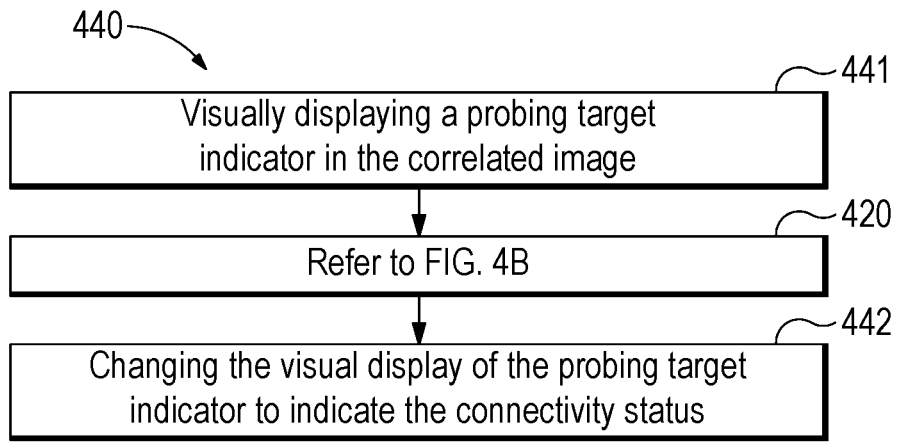
FIG. 4C illustrates a portion of the method of FIG. 4A, according to an example configuration.

With particular reference to FIG. 4C, in configurations, at the process labeled 440 (beginning with the sub-process labeled 441), indicating the probing target (at the process labeled 406) includes visually displaying a probing target indicator in the correlated image. The probing target indicator may be, for example, an arrow, a circle, an "X," highlight, or other visual indication of the probing target. The probing target indicator and the correlated image may be displayed, for example, on a display device 104 such as a computer display.

As illustrated in FIG. 4C, the process labeled 440 may include, as a sub-process, the process labeled 420, as discussed above. At the process labeled 442, the visual display of the probing target indicator may be changed to indicate the connectivity status. In configurations, changing the visual display of the probing target indicator to indicate the connectivity status includes changing a color of the probing target indicator. For example, if (at the process labeled 422) it is determined that electrical connectivity exists between the desired network node 203 of the fabricated circuit 201 and the test-and-measurement instrument 103, then the color of the probing target indicator (which is displayed on the correlated image) may change from red to green. Other colors could also be used. In configurations, changing the visual display of the probing target indicator to indicate the connectivity status includes changing a shape of the probing target indicator. For example, if (at the process labeled 422) it is determined that electrical connectivity exists between the desired network node 203 of the fabricated circuit 201 and the test-and-measurement instrument 103, then the shape of the probing target indicator (which is displayed on the correlated image) may change from a minus sign (−) to a plus sign (+). Other shapes could also be used.

Figure 4D:
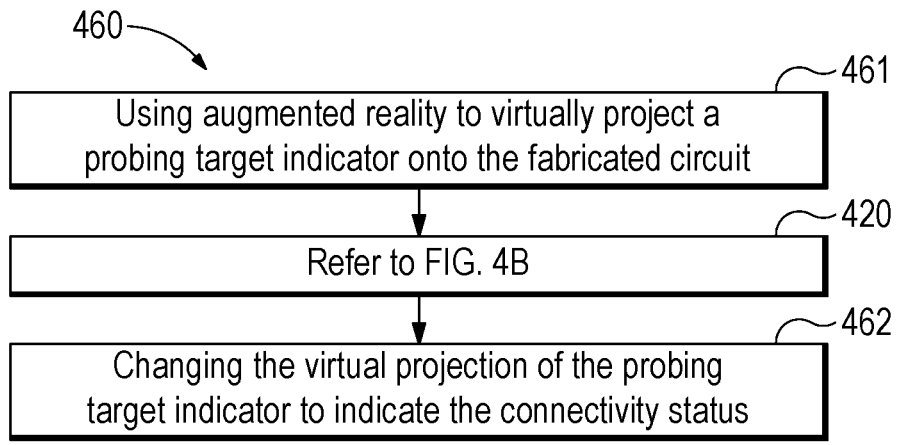
FIG. 4D illustrates a portion of the method of FIG. 4A, according to an example configuration.

With particular reference to FIG. 4D, in configurations, at the process labeled 460 (beginning with the sub-process labeled 461), indicating the probing target (at the process labeled 406) includes using augmented reality functionality 105 to virtually project a probing target indicator onto the fabricated circuit at a location corresponding to the desired network node 203 of the fabricated circuit 201. For example, three-dimensional mapping may be used to project a virtual target in an augmented reality environment. Accordingly, the human operator may visually observe (in the augmented reality environment) the probing target indicator, which would appear to be on the desired network node 203 of the fabricated circuit 201.

As illustrated in FIG. 4D, the process labeled 460 may include, as a sub-process, the process labeled 420, as discussed above. At the process labeled 462, the virtual projection of the probing target indicator may be changed to indicate the connectivity status. In configurations, changing the virtual projection of the probing target indicator to indicate the connectivity status includes changing a color or a shape of the probing target indicator. Hence, as noted above for other examples, the color of the probing target indicator may change from red to green, or the shape of the probing target indicator may change from a minus sign to a plus sign, if (at the process labeled 422) it is determined that electrical connectivity exists between the desired network node 203 of the fabricated circuit 201 and the test-and-measurement instrument 103. Other colors or shapes could also be used.

Figure 4E:
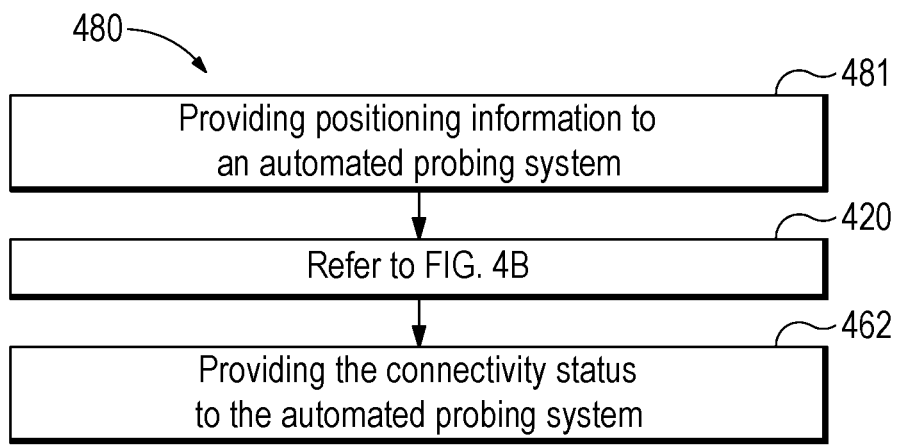
FIG. 4E illustrates a portion of the method of FIG. 4A, according to an example configuration.

With particular reference to FIG. 4E, in configurations, at the process labeled 480 (beginning with the sub-process labeled 481), indicating the probing target (at the process labeled 406) includes providing positioning information to an automated probing system 106. The positioning information corresponds to a location of the desired network node 203 of the fabricated circuit 201. The automated probing system 106 may be part of the test-and-measurement instrument 103 and may include, for example, a robotic arm, a three-axis positioning device, or another mechanical positioning device configured to position the probe coupled to the test-and-measurement instrument 103 with respect to the fabricated circuit 201. The positioning information may include, for example, three-dimensional mapping to provide a mechanical location for the mechanical positioning device.

As illustrated in FIG. 4E, the process labeled 480 may include, as a sub-process, the process labeled 420, as discussed above. At the process labeled 482, the connectivity status may be provided to the automated probing system 106. The connectivity status may be provided, for example, as feedback to confirm that the mechanical positioning device has correctly positioned the probe of the test-and-measurement instrument 103 with respect to the desired network node 203 of the fabricated circuit 201.

In configurations, a processor, such as the processor 101 depicted in FIG. 1, may be configured to interact with the vision system 102 and the test-and-measurement instrument 103. In configurations, the processor 101 may be configured to perform one or more of the processes illustrated in FIGS. 4A to 4D.

Furthermore, aspects may operate on a particularly created hardware, on firmware, digital signal processors, or on a specially programmed general-purpose computer including a processor operating according to programmed instructions. The terms "controller" or "processor" as used herein are intended to include microprocessors, microcomputers, ASICs, and dedicated hardware controllers. One or more aspects may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various configurations. In addition, the functionality may be embodied in whole or in part in firmware or hardware equivalents such as integrated circuits, field programmable gate arrays (FPGA), and the like. Particular data structures may be used to more effectively implement one or more aspects of the disclosed systems and methods, and such data structures are contemplated within the scope of computer executable instructions and computer-usable data described herein.

EXAMPLES

Illustrative examples of the disclosed technologies are provided below. A particular configuration of the technologies may include one or more, and any combination of, the examples described below.

Example 1 includes a method for indicating a probing target for a fabricated electronic circuit, the method comprising: generating an electronic, three-dimensional model based on manufacturing layout information of a fabricated circuit; obtaining, with a vision system, visual environment information for the fabricated circuit; scaling and orienting the three-dimensional model by a scaler and mapper based on the visual environment information; overlaying the three-dimensional model with the visual environment information to produce a correlated image; obtaining an identification of a desired network node of the fabricated circuit; and indicating a probing target, the probing target corresponding to the desired network node of the fabricated circuit.

Example 2 includes the method of Example 1, in which obtaining visual environment information for the fabricated circuit includes obtaining locations of one or more fiducial markers for the fabricated circuit.

Example 3 includes the method of any of Examples 1-2, in which scaling and orienting the three-dimensional model includes edge detecting and pattern matching.

Example 4 includes the method of any of Examples 1-3, further comprising: coupling a probe between the desired network node of the fabricated circuit and a test-and-measurement instrument; and determining whether electrical connectivity exists between the desired network node of the fabricated circuit and the test-and-measurement instrument.

Example 5 includes the method of any of Examples 1-4, in which indicating the probing target comprises visually displaying a probing target indicator in the correlated image.

Example 6 includes the method of Example 5, further comprising: coupling a probe of a test-and-measurement instrument to the desired network node of the fabricated circuit; determining a connectivity status, the connectivity status being whether electrical connectivity exists between the desired network node of the fabricated circuit and the test-and-measurement instrument; and changing the visual display of the probing target indicator to indicate the connectivity status.

Example 7 includes the method of Example 6, in which changing the visual display of the probing target indicator to indicate the connectivity status comprises changing at least one of a color of the probing target indicator and a shape of the probing target indicator.

Example 8 includes the method of any of Examples 1-7, in which indicating the probing target comprises using augmented reality to virtually project a probing target indicator onto the fabricated circuit at a location corresponding to the desired network node of the fabricated circuit.

Example 9 includes the method of Example 8, further comprising: coupling a probe between the desired network node of the fabricated circuit and a test-and-measurement instrument; determining a connectivity status, the connectivity status being whether electrical connectivity exists between the desired network node of the fabricated circuit and the test-and-measurement instrument; and changing the virtual projection of the probing target indicator to indicate the connectivity status.

Example 10 includes the method of Example 9, in which changing the virtual projection of the probing target indicator to indicate the connectivity status comprises changing at least one of a color of the probing target indicator and a shape of the probing target indicator.

Example 11 includes the method of any of Examples 1-10, in which indicating the probing target comprises providing positioning information to an automated probing system, the positioning information corresponding to a location of the desired network node of the fabricated circuit.

Example 12 includes the method of Example 11, further comprising: coupling a probe between the desired network node of the fabricated circuit and a test-and-measurement instrument; determining a connectivity status, the connectivity status being whether electrical connectivity exists between the desired network node of the fabricated circuit and the test-and-measurement instrument; and providing the connectivity status to the automated probing system.

Example 13 includes the method of any of Examples 1-12, further comprising obtaining, with the test-and-measurement instrument, a measured waveform from the desired network node of the fabricated circuit.

Example 14 includes a non-transitory computer-readable medium having computer-executable instructions stored thereon that, in response to execution by a computing device, cause the computing device to perform operations, the operations comprising: generating an electronic, three-dimensional model based on manufacturing layout information of a fabricated circuit; obtaining, from a vision system, visual environment information for the fabricated circuit; scaling and orienting the three-dimensional model based on the visual environment information; overlaying the three-dimensional model with the visual environment information to produce a correlated image; obtaining an identification of a desired network node of the fabricated circuit; and indicating a probing target, the probing target corresponding to the desired network node of the fabricated circuit.

Example 15 includes the non-transitory computer-readable medium of Example 14, in which obtaining visual environment information for the fabricated circuit includes obtaining locations of one or more fiducial markers for the fabricated circuit.

Example 16 includes the non-transitory computer-readable medium of any of Examples 14-15, in which scaling and orienting the manufacturing layout information includes performing an edge detection function and a pattern matching function.

Example 17 includes the non-transitory computer-readable medium of Example 14, in which indicating the probing target comprises causing a computer display to visually display a probing target indicator in the correlated image.

Example 18 includes the non-transitory computer-readable medium of Example 17, further comprising: determining a connectivity status, the connectivity status being whether electrical connectivity exists between the desired network node of the fabricated circuit and a test-and-measurement instrument; and changing the visual display of the probing target indicator to indicate the connectivity status.

Example 19 includes the non-transitory computer-readable medium of Example 18, in which changing the visual display of the probing target indicator to indicate the connectivity status comprises changing at least one of a color of the probing target indicator and a shape of the probing target indicator. Example 20 includes the non-transitory computer-readable medium of any of Examples 14-19, in which indicating the probing target comprises causing an augmented reality device to virtually project a probing target indicator onto the fabricated circuit at a location corresponding to the desired network node of the fabricated circuit.

Example 21 includes the non-transitory computer-readable medium of Example 20, further comprising: determining a connectivity status, the connectivity status being whether electrical connectivity exists between the desired network node of the fabricated circuit and a test-and-measurement instrument; and causing the augmented reality device to change the virtual projection of the probing target indicator to indicate the connectivity status.

Example 22 includes the non-transitory computer-readable medium of Example 21, in which causing the augmented reality device to change the virtual projection of the probing target indicator to indicate the connectivity status comprises causing the augmented reality device to change at least one of a color of the probing target indicator and a shape of the probing target indicator.

Example 23 includes the non-transitory computer-readable medium of any of Examples 14-22, in which indicating the probing target comprises providing positioning information to an automated probing system, the positioning information corresponding to a location of the desired network node of the fabricated circuit.

Example 24 includes the non-transitory computer-readable medium of Example 23, further comprising: determining a connectivity status, the connectivity status being whether electrical connectivity exists between the desired network node of the fabricated circuit and a test-and-measurement instrument; and providing the connectivity status to the automated probing system.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular example configuration, that feature can also be used, to the extent possible, in the context of other example configurations.

Also, when reference is made in this application to a method having two or more defined steps, processes, or operations, the defined steps, processes, or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Although specific example configurations have been described for purposes of illustration, it will be understood that various modifications may be made without departing from the spirit and scope of the disclosure.

I claim:

1. A method for indicating a probing target for a fabricated electronic circuit, the method comprising:
generating an electronic, three-dimensional model based on manufacturing layout information of a fabricated circuit;
obtaining, with an augmented reality vision system, visual environment information for the fabricated circuit;
scaling and orienting the three-dimensional model by a scaler and mapper based on the visual environment information;
overlaying the three-dimensional model with the visual environment information to produce a correlated image;
obtaining an identification of a desired network node of the fabricated circuit; and
indicating a probing target, the probing target corresponding to the desired network node of the fabricated circuit.

2. The method of claim 1, in which obtaining visual environment information for the fabricated circuit includes obtaining locations of one or more fiducial markers for the fabricated circuit.

3. The method of claim 1, in which scaling and orienting the three-dimensional model includes edge detecting and pattern matching.

4. The method of claim 1, further comprising:
coupling a probe between the desired network node of the fabricated circuit and a test-and-measurement instrument; and
determining whether electrical connectivity exists between the desired network node of the fabricated circuit and the test-and-measurement instrument.

5. The method of claim 1, in which indicating the probing target comprises visually displaying a probing target indicator in the correlated image.

6. The method of claim 5, further comprising:
coupling a probe between the desired network node of the fabricated circuit and a test-and-measurement instrument;
determining a connectivity status, the connectivity status being whether electrical connectivity exists between the desired network node of the fabricated circuit and the test-and-measurement instrument; and
changing the visual display of the probing target indicator to indicate the connectivity status.

7. The method of claim 6, in which changing the visual display of the probing target indicator to indicate the connectivity status comprises changing at least one of a color of the probing target indicator and a shape of the probing target indicator.

8. The method of claim 1, in which indicating the probing target comprises using augmented reality to virtually project a probing target indicator onto the fabricated circuit at a location corresponding to the desired network node of the fabricated circuit.

9. The method of claim 8, further comprising:
coupling a probe between the desired network node of the fabricated circuit and a test-and-measurement instrument;
determining a connectivity status, the connectivity status being whether electrical connectivity exists between the desired network node of the fabricated circuit and the test-and-measurement instrument; and
changing the virtual projection of the probing target indicator to indicate the connectivity status.

10. The method of claim 9, in which changing the virtual projection of the probing target indicator to indicate the connectivity status comprises changing at least one of a color of the probing target indicator and a shape of the probing target indicator.

11. The method of claim 1, in which indicating the probing target comprises providing positioning information to an automated probing system, the positioning information corresponding to a location of the desired network node of the fabricated circuit.

12. The method of claim 11, further comprising:
coupling a probe between the desired network node of the fabricated circuit and a test-and-measurement instrument;
determining a connectivity status, the connectivity status being whether electrical connectivity exists between the desired network node of the fabricated circuit and the test-and-measurement instrument; and
providing the connectivity status to the automated probing system.

13. The method of claim 1, further comprising obtaining, with the test-and-measurement instrument, a measured waveform from the desired network node of the fabricated circuit.

14. A non-transitory computer-readable medium having computer-executable instructions stored thereon that, in response to execution by a computing device, cause the computing device to perform operations, the operations comprising:
generating an electronic, three-dimensional model based on manufacturing layout information of a fabricated circuit;
obtaining, from an augmented reality vision system, visual environment information for the fabricated circuit;
scaling and orienting the three-dimensional model based on the visual environment information;
overlaying the three-dimensional model with the visual environment information to produce a correlated image;
obtaining an identification of a desired network node of the fabricated circuit; and
indicating a probing target, the probing target corresponding to the desired network node of the fabricated circuit.

15. The non-transitory computer-readable medium of claim 14, in which obtaining visual environment information for the fabricated circuit includes obtaining locations of one or more fiducial markers for the fabricated circuit.

16. The non-transitory computer-readable medium of claim 14, in which scaling and orienting the manufacturing layout information includes performing an edge detection function and a pattern matching function.

17. The non-transitory computer-readable medium of claim 14, in which indicating the probing target comprises causing a computer display to visually display a probing target indicator in the correlated image.

18. The non-transitory computer-readable medium of claim 17, further comprising:
determining a connectivity status, the connectivity status being whether electrical connectivity exists between the desired network node of the fabricated circuit and a test-and-measurement instrument; and
changing the visual display of the probing target indicator to indicate the connectivity status.

19. The non-transitory computer-readable medium of claim 18, in which changing the visual display of the probing target indicator to indicate the connectivity status comprises changing at least one of a color of the probing target indicator and a shape of the probing target indicator.

20. The non-transitory computer-readable medium of claim 14, in which indicating the probing target comprises causing an augmented reality device to virtually project a probing target indicator onto the fabricated circuit at a location corresponding to the desired network node of the fabricated circuit.

21. The non-transitory computer-readable medium of claim 20, further comprising:
determining a connectivity status, the connectivity status being whether electrical connectivity exists between the desired network node of the fabricated circuit and a test-and-measurement instrument; and
causing the augmented reality device to change the virtual projection of the probing target indicator to indicate the connectivity status.

22. The non-transitory computer-readable medium of claim 21, in which causing the augmented reality device to change the virtual projection of the probing target indicator to indicate the connectivity status comprises causing the augmented reality device to change at least one of a color of the probing target indicator and a shape of the probing target indicator.

23. The non-transitory computer-readable medium of claim 14, in which indicating the probing target comprises providing positioning information to an automated probing system, the positioning information corresponding to a location of the desired network node of the fabricated circuit.

24. The non-transitory computer-readable medium of claim 23, further comprising:
determining a connectivity status, the connectivity status being whether electrical connectivity exists between the desired network node of the fabricated circuit and a test-and-measurement instrument; and
providing the connectivity status to the automated probing system.

* * * * *